United States Patent [19]

Gomez

[11] 4,251,291
[45] Feb. 17, 1981

[54] THERMOELECTRIC GENERATOR WITH LATENT HEAT STORAGE

[76] Inventor: Ernesto E. Gomez, Avianca Bldg., Third Floor, 1612 Ponce de Leon Ave., Santurce, P.R. 00909

[21] Appl. No.: 8,439

[22] Filed: Feb. 1, 1979

[51] Int. Cl.³ .............................................. H01L 35/00
[52] U.S. Cl. ..................... 136/206; 126/430; 126/443; 126/444; 136/211; 136/212; 136/224
[58] Field of Search ............... 136/206, 211, 212, 224; 126/430, 443, 444

[56] References Cited

U.S. PATENT DOCUMENTS

| 2,984,696 | 5/1961 | Shaffer | 136/212 |
| 3,088,989 | 5/1963 | Lipkis | 136/206 |
| 3,594,803 | 7/1971 | Pucillo | 136/206 |
| 4,091,798 | 5/1978 | Fletcher | 126/443 |
| 4,125,122 | 11/1978 | Stachurski | 136/212 X |

FOREIGN PATENT DOCUMENTS

| 2723252 | 12/1977 | Fed. Rep. of Germany | 126/444 |
| 2736983 | 3/1979 | Fed. Rep. of Germany | 126/444 |

OTHER PUBLICATIONS

Stepler, Popular Science, vol. 212, No. 5, May, 1978, p. 91
Cordman, Popular Science, vol. 213, No. 4, Oct., 1978, p. 131.

Primary Examiner—Leland A. Sebastian
Attorney, Agent, or Firm—Peter L. Berger

[57] ABSTRACT

Energy storage is accomplished for use with a thermoelectric generator in which thermopiles are provided. The source of solar energy irradiates upon the latent heat storage device to enable the heat to be stored at a relatively constant temperature to serve as the source of heat for a greater period of time than that which the solar source is providing energy. Apparatus is provided to enhance the temperature gradient in which the thermopile is located in order to increase the thermoelectric energy generated.

12 Claims, 6 Drawing Figures

THERMOELECTRIC GENERATOR WITH LATENT HEAT STORAGE

BACKGROUND OF THE INVENTION

This invention relates to a thermoelectric generator, and more particularly, to a thermoelectric generator in which solar energy is stored during periods when the sun is not shining.

The field of solar energy collection, storage and generation has been expanding greatly in the recent past. There are many different devices for collecting the energy of the sun, and these devices generally include a means for receiving the solar energy upon a plate of solar collectors, which solar energy is converted into other forms of usable energy.

One of the active areas of present concern is the generation of electric power from solar energy, and the present invention is directed to this type of system. One of the conventional problems found in solar generators is the inability to provide thermoelectric power during low sunlight periods.

An object of this invention is to provide a thermoelectric generator utilizing solar energy, which is capable of producing thermoelectric power during periods of time when sunlight is unavailable.

Another object of this invention is to provide such a thermoelectric generator which operates efficiently, economically, and is susceptible of widespread use.

Yet another object of this invention is to provide such a thermoelectric generator which is simple to construct, easy to use, and economical in operation.

Another object of this invention is to provide a thermoelectric generator which is capable of being used in different environments, such as environments in which the generation of electricity is remote from the collection of solar energy.

Another object of this invention is to provide a thermoelectric generator in which the voltage regulation is easily and efficiently achieved without recourse to complicated electrical circuitry.

Still another object of this invention is to provide such a thermoelectric generator which accumulates energy during the day for use at night without the provision of bulky and expensive storage batteries.

Another object of this invention is to provide such a thermoelectric generator in which the latent heat storage is provided so as to regulate the temperature to which the thermopiles are subjected and to closely control design limits to eliminate potential damage to the solar collectors.

Other objects, advantages and features of this invention will become more apparent from the following description.

SUMMARY OF THE INVENTION

In accordance with the principles of this invention, the above objects are accomplished by providing a thermoelectric generator in which thermopiles are provided for generating electricity, with one end of the thermopile being located in the cold region while the other end is located in the hot region. The invention comprises a solar collector for receiving energy from the solar source, an absorber plate and heat storage means for absorbing the solar energy and storing this solar energy, the storage means comprising a latent heat storage medium, and locating said thermopiles in the region of said heat storage means to cause thermoelectric power to be generated.

The provision of a latent heat storage medium in combination with the absorber plate for the solar collector in order to provide a temperature gradient sufficient to cause the thermopiles to generate thermoelectric power permits energy accumulation during the day for use at night, by controlling the temperature at which the medium changes from state to state.

Temperature rises during the day until the melting point of the medium is reached, and the heat input from the sun thereafter further melts the medium, without raising the temperature of the storage medium. At night, or when the sun is cloud covered, the heat storage again changes state, such as by freezing, releasing the heat absorbed to provide a source of heat for the thermopiles. Since the material chosen can have its latent heat fusion selected, while the material remains partially molten, the temperature remains constant and therefore, the voltage output of the thermoelectric generator or thermopiles also is constant.

Several embodiments are presented in which the solar collector is remotely located from the storage medium, so as to provide various embodiments in which the present invention may advantageously be used.

DETAILED DESCRIPTION

Figure 1:
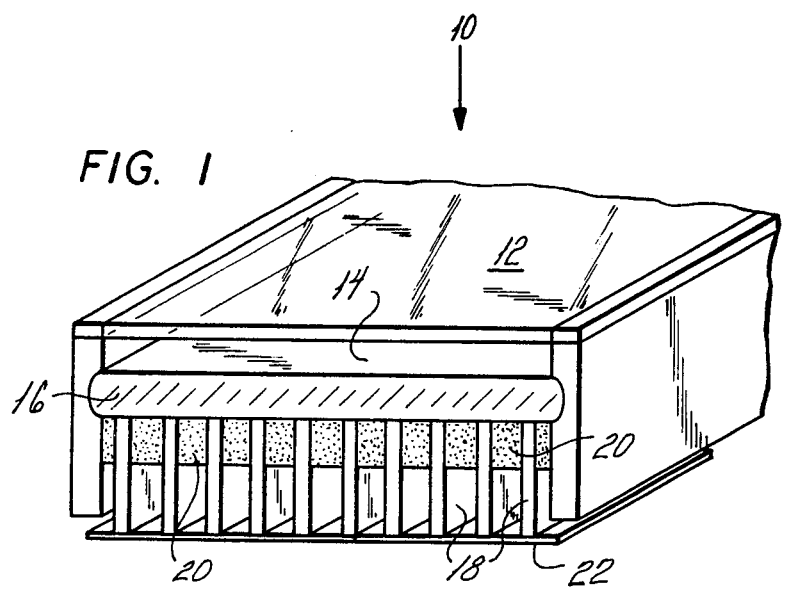
FIG. 1 is a perspective view of one embodiment of the present invention in which a latent heat storage medium is employed with a solar collector and thermopiles.

Referring now to FIG. 1, a source of light such as solar light irradiates from direction 10 toward a transparent cover 12, which is formed of a double wall transparent construction, and the light passes through said transparent cover 12 to impinge upon an absorber plate 14. The absorber plate absorbs the solar energy and is integrally formed with a heat storage medium and means 16. A plurality of thermopiles 18 are connected below and to the heat storage medium 16, and thermal insulation 20 is provided in the upper region of thermopiles 18 in the area of the heat storage medium. A bottom radiator plate 22 is provided to cool the bottom portion of the thermopiles which are remotely located from the heat storage medium 16.

The invention will be briefly described in further detail with regard to FIG. 1, while the other embodiments will be described hereinafter.

The transparent cover 12 may be formed of a double cover for purposes of heat insulation, and is capable of passing sunlight therethrough to irradiate on the absorber plate 14. The absorber plate has the heat storage means and medium 16 integrally formed therewith, and one possible arrangement being to provide a double plate for absorber plate 14 having a heat storage medium such as lithium nitrite, stannous chloride or aluminum iodide filled therein. During the day, the temperature will rise until the melting point of the materials stored within the heat storage means 16 reaches its melting point, and the heat input from the sun thereafter would further melt the heat storage material, without raising the temperature thereof. When the source of solar light terminates, the heat storage medium state changes, and in this case, would freeze, and heat would be released at a constant temperature as the material continues to change from its molten to the solid state.

In order to further insulate and retain the heat stored in medium 16, thermal insulation 20 is tightly packed against the bottom of the heat storage means 16 to hold the heat therewithin as efficiently as possible. Interspersed between the heat insulation means 20 are thermopiles 18, which have a general vertical orientation. The thermopiles are arranged so that the top portion is in the proximity of the heat storage means, while the bottom portion is in the proximity of the radiator plate 22.

In operation, the thermopiles provide thermoelectric power related to the temperature gradient between the upper and lower portions thereof, and with the present invention, the upper temperature is maintained fairly constant over a large period of time. The period of time will be greater than that during which the sun is shining, and is related to the material used as the heat storage medium as well as the other construction features for ensuring temperature gradient across the thermopiles and retaining heat in the heat storage means 16. The above-described chemicals have a general latent heat of fusion at approximate 150°, and under conventional collection proceedings, normal irradiated sun passing through the transparent cover absorber plate and heat storage medium will easily reach that level.

As a matter of design choice and overall efficiency, maximum power output would be less than peak power obtainable under maximum sun conditions, such as at high noon. To provide for peak power demand greater than that supplied by the heat storage device, a supplemental battery system can be provided which would store electricity when the demand is below peak. This battery system need only store enough energy for several hours of maximum demand, and the system does not have to accommodate to fluctuating voltages from a solar collector, since the voltage output from the solar collector system illustrated in FIG. 1 is constant in view of the constant temperature achieved through use of a latent heat of fusion material forming the heat storage medium.

Figure 2:
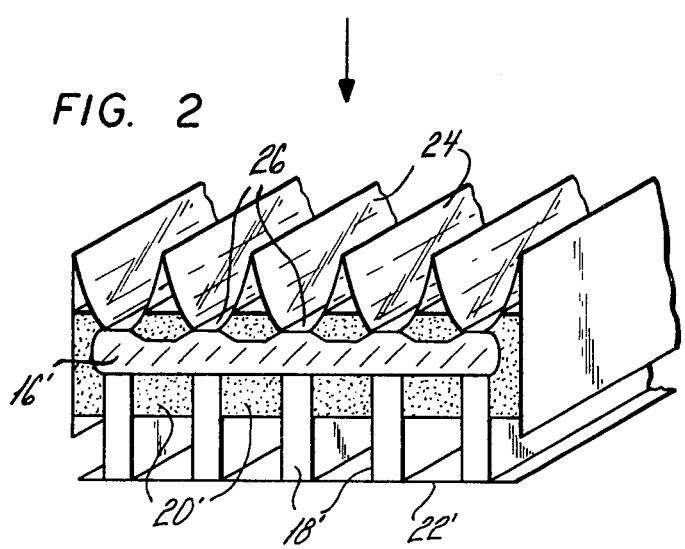
FIG. 2 is an alternate embodiment, similar to FIG. 1, in which parabolic solar collectors are employed.

FIG. 2 is a perspective view of another embodiment of my invention in which parabolic collectors 24 are employed to collect the solar energy. In view of the parabolic shape of these collectors, which replaces the transparent cover of the embodiment of FIG. 1, absorbers 26 have a different configuration and sit within the base of the parabolic collectors to absorb the heat collected by collectors 24. In other respects, the embodiment of FIG. 2 is similar to FIG. 1 with a storage means 16' being provided having a storage medium for changing its state to store the heat through the latent heat of fusion principle described above. Further, there is provided thermal insulation 20', thermopiles 18' and a bottom radiator plate 22' which are arranged in the same manner and accomplish the same function as described above with regard to FIG. 1. The parabolic collector enable the temperatures to which the absorber plate can be heated to be increased over that achievable with the flat absorber plates and as a consequence, an increase in stored energy is achievable with said parabolic collectors.

The embodiments illustrated in FIGS. 1 and 2 represent a compact thermoelectric generator system. Energy may also be stored, as is currently done for solar heating and cooling systems, in a tank located away from the absorber plate. This is a more complicated system, but has the advantage that a separate tank may be better insulated. Heat transfer from the collector to the tank may be effected by a fluid heat transfer medium, by heat pipes or by the storage material itself. In this case, it may be advantageous to store heat in the transition from liquid to gas of a substance with a suitable boiling point. The thermopiles could be attached to the solar absorber, and the flow of heat to and from the storage tank can be adjusted, as appropriate. FIGS. 3 through 6 illustrate such systems.

Figure 3:
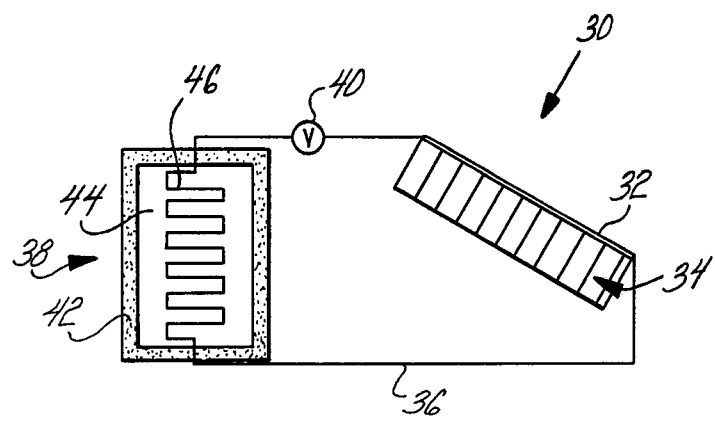
FIG. 3 is a schematic representative diagram illustrating another embodiment of the invention in which heat is stored in a region remotely located from a thermopile.

Referring now to FIG. 3, there is shown a source of light 30 irradiating upon an absorber plate 32 below which are connected thermopiles 34. A conduit 36 is provided connected between absorber 32 and a remote storage tank 38. The storage medium, as described above, may be chosen to be a material which stores heat in the transition from liquid to gas, and the gaseous materials carried in conduits 36 between absorber plate 32 and storage tank 38. A valve 40 is provided between the absorber plate 32 and storage tank 38 to allow the storage material to pass from the absorber plate to the storage tank when the gaseous state has been reached. The storage tank may be provided with an outer thermal insulation covering 42 surrounding a heat storage medium 44 within which there is located a heat exchanger 46. The heat storage medium 44 changes from its liquid to gaseous state in accordance with the temperature to which the absorber plates is subjected, and valve 40 enables the remotely located heat storage medium to flow between thermopiles 34 and the storage tank 38, as appropriate for the generation of thermoelectric power from the thermopiles. The thermopiles may be arranged to have a suitable radiator plate (not shown) as appropriate.

Figure 4:
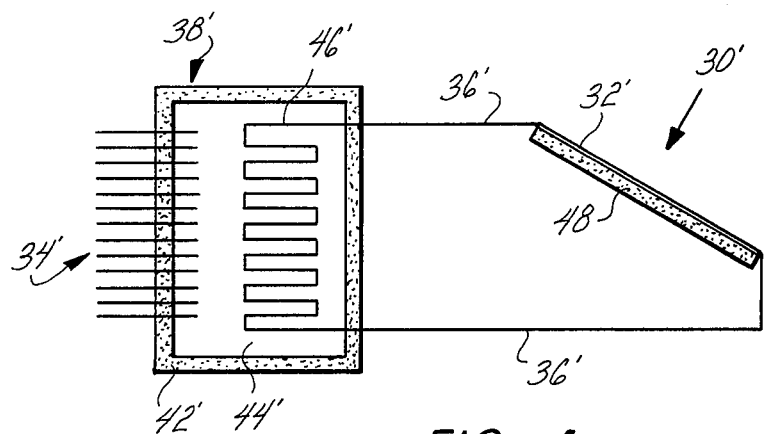
FIG. 4 is another view similar to FIG. 3 in which the thermopiles and heat storage medium are remotely located from the absorber.

Referring now to FIG. 4, there is shown yet another embodiment of a remotely located storage tank 38' in which a source of light 30' irradiates upon an absorber plate 32'. In the embodiment of FIG. 4, valve 40 (see FIG. 3) is dispensed with, and a conduit 36' is provided between absorber plate 32' and storage tank 38'. The heat storage tank 38' is surrounded by a thermal insulation 42', and an additional thermal insulation 48 is provided on the bottom of absorber 32'. The heat exchanger 46' is located within storage tank 38', and in this embodiment, thermopiles 34' are located in the region of the storage tank 38'. This arrangement may be suitable where a large construction facility is employed in which the thermopiles are remotely located from the absorber plate. Although the efficiency is somewhat reduced, the size of the thermopiles and storage tank may be significantly larger than that achievable with the more compact unit of FIGS. 1 through 3, so that longer term storage of power may be provided.

Figure 5:
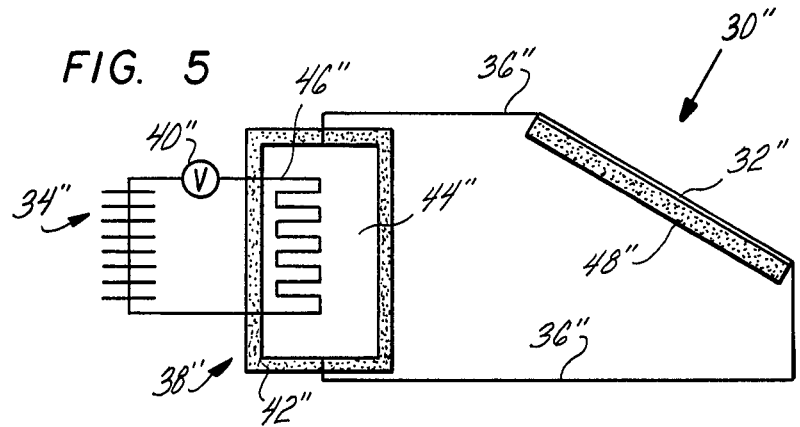
FIG. 5 is another embodiment similar to FIGS. 3 and 4 in which the thermopiles are remotely located from the heat storage medium which itself is remotely located from the heat absorber.

FIG. 5 is yet another embodiment of a remotely located storage tank 38" having a source of light 30"

impinging upon an absorber plate 32". Insulation 48" is located beneath absorber plate 32", and conduit 36" carries the storage medium or heat transfer material from absorber plate 32' to storage tank 38". Located within storage tank 38" is a heat exchanger 46" in which the heat storage medium is located as well as an outer thermal insulation 42". A valve 40" allows further heat transfer medium to flow between the storage tank and the remotely located thermopiles 34". This arrangement as shown in FIG. 5 is similar to that of FIG. 4 in which the heat may be stored remotely from the collectors. The further embodiment of FIG. 5 allows for the generation of electricity by thermopiles 34" at any time desired merely by operating valve 40". Thus, there is complete autonomy in the operation of the energy system illustrated in FIG. 5.

Figure 6:
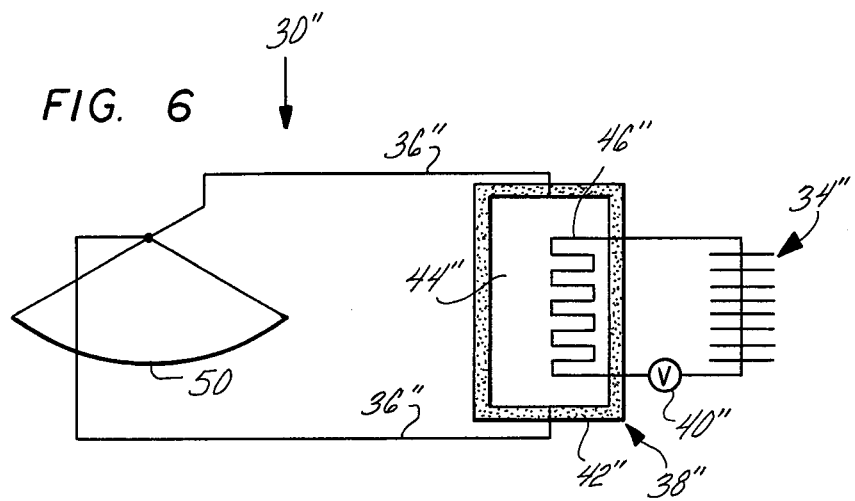
FIG. 6 is another view similar to FIG. 5 in which parabolic collectors are utilized for receiving the solar energy.

FIG. 6 is yet another embodiment of my invention, which is similar to FIG. 5, but concentrating collectors 50 are substituted for the flat plate collectors found in the embodiments illustrated in FIGS. 3 through 5. In all respects, the apparatus of FIG. 6 operates similarly to FIG. 5.

As illustrated above, my invention serves to accomplish four key functions, which are not found in the prior art.

My invention permits energy accumulation during the day and utilization of the energy during the day and at night. Depending upon the quantity of heat storage medium selected, and upon the temperature at which the latent heated fusion comes into operation, the energy storage can be for long periods of time. Further, peak power demands may be met by the provision of relatively efficient and small battery systems, and in view of the constant voltage output provided by my invention, such storage batteries may be efficiently charged.

Since the temperature remains constant in view of the latent heat of fusion techniques, voltage regulation is provided without recourse to complicated electronics circuitry. Voltage will remain constant as long as the temperature does, and since maximum current depends upon the internal resistance, maximum power generation may also be constant.

Although the peak efficiency of the solar convertor is higher without latent heat storage, since the maximum temperature is higher, the average efficiency over a twenty-four period is increased significantly by the use of latent heat storage, since it keeps the convertor working at a fairly high efficiency for a much longer period of time.

Latent heat storage in the collector plate also serves to regulate the temperature in the region of the collector, and prevent the temperature from rising above design limits to damage the collector.

Provision of energy upon demand, as with the valve arrangement in FIGS. 3, 5 and 6 represents a significant improvement over the art, and further enables large scale thermoelectric generators to be provided.

STATEMENT OF PRIOR ART

A prior art search has been conducted and the most relevant prior patent discovered was that to Shaffer, U.S. Pat. No. 2,984,696. The Shaffer patent fails to show, suggest or disclose the provision or use of energy storage means, such as employing a latent heat of fusion technique, and therefore is inapplicable to the present invention.

An article appearing in the March 1977 issue of *Consulting Engineer*, Volume 48, No. 3 entitled "Designing and Citing Solar Power Plants" shows the use of thermo-storage in connection with solar collectors. Since the specific arrangement illustrated and claimed in the present invention is neither shown, suggested nor disclosed in said publication, applicant's invention, as claimed, is patentable over this publication.

I claim:

1. A thermoelectric generator comprising a thermopile having one end to be placed in a hot region and the other end in a cold region, for the generation of electricity, means for generating regions of relative heat and cold comprising solar collector means for receiving power from a solar source, absorber plate means connected with said solar collector means to absorb the heat of the sun impinging on said solar collector means, heat storage means for storing the heat absorbed in said absorber plate, said heat storage means comprising a storage material having a latent heat of fusion, said storage material changing its state under the influence of temperature reached when said absorber receives said heat, said heat storage means forming a source of substantially constant heat level for supplying heat to said thermopile, said heat storage means conveying its stored heat to said thermopiles to cause electric power to be generated, said electric power generated by said thermopile being substantially constant.

2. A thermoelectric generator as claimed in claim 1, further comprising a radiator means connected with said thermopiles in said cold region to enhance the temperature gradient across said thermopile.

3. A thermoelectric generator as claimed in claim 2, further comprising a transparent cover located between the solar source and said absorber plate said transparent cover comprising a double walled plate.

4. A thermoelectric generator as claimed in claim 2, further comprising insulation means located beneath said heat storage means and held in contact therewith, said solar source being located above said heat storage medium.

5. A thermoelectric generator as claimed in claim 4, wherein said heat storage medium is integrally formed with said absorber plate, said absorber plate and storage medium comprising a sealed container located below said absorber plate, said sealed container holding said storage medium.

6. A thermoelectric generator as claimed in claim 1, wherein said solar collector means comprises parabolic collectors.

7. A thermoelectric generator as claimed in claim 1, wherein said heat storage means is remotely located from said solar collector means and said absorber plate means, further comprising heat exchange fluid for transferring the heat from said absorber plate to said heat storage means, and conduit means connected between said heat storage means and said absorber plate means for carrying said fluid.

8. A thermoelectric generator as claimed in claim 7, further comprising valve means located in said conduit to control the time when the heat storage means supplies its stored heat to said thermopiles.

9. A thermoelectric generator as claimed in claims 1 or 8, wherein said thermopiles are connected with said absorber plate means.

10. A thermoelectric generator as claimed in claim 7, wherein said thermopiles are connected to said heat storage means.

11. A thermoelectric generator as claimed in claim 7, further comprising second conduit means connected between said heat storage means and thermopiles, said thermopiles being remotely located with respect to said heat storage means, and heat exchange fluid located in said second conduit means, said second conduit comprising second valve means for controlling the flow of heat from said heat storage means to said thermopiles.

12. A thermoelectric generator as claimed in claims 7 or 11, wherein said heat exchange fluid is formed of said storage material having said latent heat of fusion.

* * * * *